US010614897B1

(12) United States Patent
Steiner

(10) Patent No.: US 10,614,897 B1
(45) Date of Patent: Apr. 7, 2020

(54) SYSTEM AND METHOD FOR HIGH PERFORMANCE SEQUENTIAL READ BY DECOUPLING OF INTER-CELL INTERFERENCE FOR NAND FLASH MEMORIES

(71) Applicant: Toshiba Memory Corporation, Tokyo (JP)

(72) Inventor: Avi Steiner, Kiriat Motzkin (IL)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/130,757

(22) Filed: Sep. 13, 2018

(51) Int. Cl.
G11C 16/04 (2006.01)
G11C 16/34 (2006.01)
G11C 16/26 (2006.01)

(52) U.S. Cl.
CPC ...... *G11C 16/3427* (2013.01); *G11C 16/0408* (2013.01); *G11C 16/26* (2013.01)

(58) Field of Classification Search
CPC .. G11C 16/3427; G11C 16/0408; G11C 16/26
See application file for complete search history.

(56) References Cited

U.S. PATENT DOCUMENTS

| | | | | |
|---|---|---|---|---|
| 8,854,880 B2* | 10/2014 | Chen | ............ | G11C 11/5642 365/185.03 |
| 9,053,804 B2* | 6/2015 | Wu | ............ | G11C 11/5642 |
| 9,524,790 B1* | 12/2016 | Steiner | ............ | G11C 11/5642 |

* cited by examiner

*Primary Examiner* — Pho M Luu
(74) *Attorney, Agent, or Firm* — Foley & Lardner LLP

(57) ABSTRACT

A flash memory system may include a cell flash memory and a circuit for performing operations of the plurality of cells. The cell flash memory may have a plurality of cells. The circuit may be configured to estimate an interference state based on a result of a read operation on a first neighboring cell of a first cell among the plurality of cells. The circuit may be configured to perform a read operation on the first cell. The circuit may be configured to generate soft information based on a result of the read operation and the interference state. The circuit may be configured to decode the result of the read operation on the first cell based on the soft information.

20 Claims, 7 Drawing Sheets

| Hard Bit | Estimated Interference State | LLR Values for decoder |
|---|---|---|
| 0 | -2 | -1 |
| 0 | -1 | -2 |
| 0 | 1 | -3 |
| 0 | 2 | -4 |
| 1 | -2 | 4 |
| 1 | -1 | 3 |
| 1 | 1 | 2 |
| 1 | 2 | 1 |

FIG. 4

SYSTEM AND METHOD FOR HIGH PERFORMANCE SEQUENTIAL READ BY DECOUPLING OF INTER-CELL INTERFERENCE FOR NAND FLASH MEMORIES

TECHNICAL FIELD

The present embodiments relate generally to memory devices and more particularly to techniques for decoupling inter-cell interference for NAND flash memory devices so as to provide high endurance and steady reading performance.

BACKGROUND

As the number and types of computing devices continue to expand, so does the demand for memory used by such devices. Memory includes volatile memory (e.g. RAM) and non-volatile memory. One popular type of non-volatile memory is flash memory or NAND-type flash. A NAND flash memory array includes rows and columns (strings) of cells. A cell may include a transistor.

During a read operation, an entire row/page of the NAND flash memory array may be read. This may be done by applying a bias voltage to all rows not being read and a reference threshold voltage to the row that should be read. The bias voltage may allow the transistor of the NAND flash memory array to fully conduct. The cells lying on the row being read will conduct only if the threshold voltage is sufficiently high to overcome the trapped charge in the floating gate. A sense amplifier may be connected to each string which measures the current through the string and outputs either a "1" or a "0" depending whether the current passed a certain threshold.

As NAND flash memory cell sizes become smaller, the scaling down of the flash memory cell sizes may cause an increase in the parasitic capacitance coupling between neighboring cells (floating gate transistors) in a flash memory block. This phenomenon, called "inter-cell interference" (ICI) may cause errors in flash memories, leading to degradation in endurance and read performance for NAND flash devices.

SUMMARY

The present embodiments relate to methods for decoupling inter-cell interference (ICI) for non-volatile memory devices such as NAND-type flash devices so as to provide high endurance and steady reading performance.

According to certain aspects, embodiments provide a flash memory system including a cell flash memory and a circuit for performing operations of the plurality of cells. The cell flash memory may have a plurality of cells. The circuit may be configured to estimate an interference state based on a result of a read operation on a first neighboring cell of a first cell among the plurality of cells. The circuit may be configured to perform a read operation on the first cell and generate soft information based on a result of the read operation on the first cell and the interference state. The circuit may be configured to decode the result of the read operation on the first cell based on the soft information. The soft information for decoding may be generated from a single read of first cell and the estimated interference state.

According to other aspects, embodiments provide a method for performing operations of a plurality of cells of a cell flash memory. The method may include estimating an interference state based on a result of a read operation on a first neighboring cell of a first cell among the plurality of cells. The method may further include performing a read operation on the first cell and generating soft information based on a result of the read operation on the first cell and the interference state. The method may further include decoding the result of the read operation on the first cell based on the soft information.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein:

FIG. 4 is a table illustrating an example aspect of mapping of hard bit and interference information into soft information in a flash memory device using example methodologies according to some embodiments;

DETAILED DESCRIPTION

According to certain aspects, embodiments in the present disclosure relate to techniques for decoupling inter-cell interference for NAND flash memory devices so as to provide high endurance and steady reading performance.

To provide systems and methods for obtaining higher endurance and higher read performance for NAND Flash devices by mitigation of interference of adjacent cells, in some embodiments, decoding may be performed efficiently with a single hard read using side information of interfering cells (or cell interference side information). In some embodiments, the cell interference side information may be probability of error in a left side (e.g., left lob tail) or right side (e.g., right lob tail) of a voltage threshold distribution due to interference state of neighboring cells (see FIGS. 2 and 3). In some embodiments, the cell interference side information may be obtained from pre-fetch of next page reads, or by saving previous read results, depending on interference characteristics. With this configuration, it is possible that no extra reads are actually performed on long sequences of sequential reads.

In some embodiments, soft information may be provided without excess reads on long sequential transactions. For example, soft information may be information on mapping a pair of hard bit and an estimated interference state into log-likelihood ratio (LLR) values (see FIG. 4). Hard bits may be created by sensing the memory cells threshold voltage at read compare levels. On the other hand, soft bits may be extra information from sensing at voltage levels other than the read compare levels. Obtaining soft bits may require extra reads at different thresholds. In some embodiments, soft information may be provided based on hard bits without using soft bits, i.e., without requiring extra reads at different thresholds.

In some embodiments, soft information may be generated by dependent page reads (e.g., reads of a page other than the target page), which can be used on previous/later reads within a sequential transaction. In some embodiments, the soft information may be generated from previous reads or future reads (i.e., pre-fetch for read) by direct mapping of raw estimated interference state to LLR values.

In some embodiments, statistical dependency modelling of the inter-cell interference (ICI) may be performed to assign reliability information to results of hard reads based on pre-fetch undecoded information. In some embodiments, information of multiple rows may be combined into a limited set of states, e.g. by taking the sum of states of neighboring cells. In some embodiments, the combined limited set of states may be used as a conditioning parameter for soft information association (e.g., mapping to LLR values).

Figure 1:
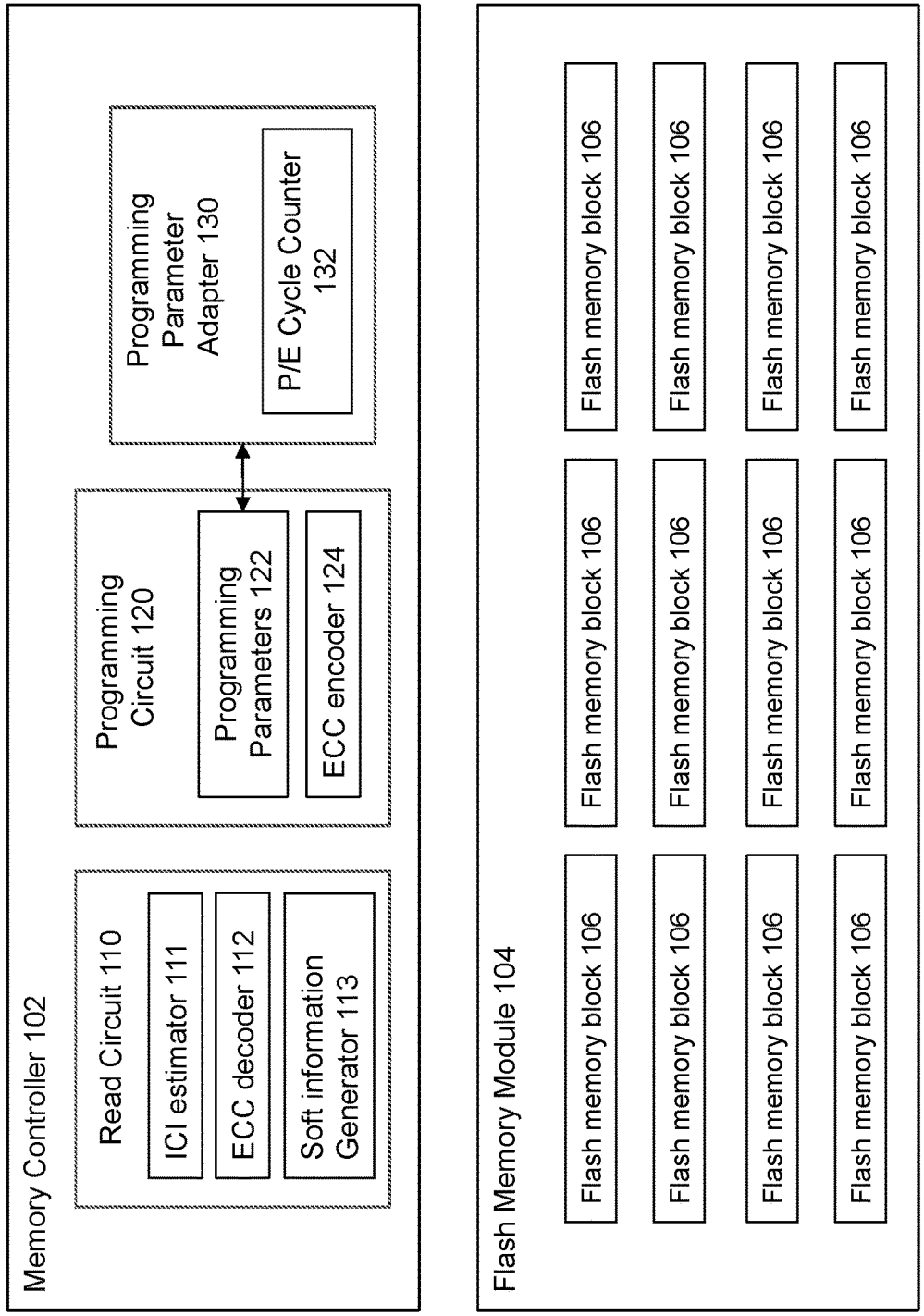
FIG. 1 is a block diagram illustrating an example flash memory system according to some embodiments.

In some embodiments, the signal processing operations for decoupling inter-cell interference as described in the present disclosure can be implemented on a NAND memory controller (e.g., the memory controller 102 in FIG. 1). In some embodiments, the signal processing operations for decoupling inter-cell interference as described in the present disclosure can be implemented by hardware or software running on a NAND memory controller (e.g., the memory controller 102 in FIG. 1). In some embodiments, the signal processing operations for decoupling inter-cell interference as described in the present disclosure can be used for implementation in storage controllers, e.g., solid state drive (SSD) controllers, universal flash storage (UFS) controllers or secure digital (SD) controllers.

The advantages of the systems and methods described in the present disclosure includes higher read performance (e.g., higher read throughput), and higher endurance and better resilience to retention and read-disturb stresses.

FIG. 1 is a block diagram illustrating an example flash memory system 100 according to some embodiments, which can perform any of the methods described in the present disclosure.

The flash system 100 may include a flash memory module or flash memory device 104 and a memory controller 102. The flash memory module 104 may include multiple flash memory blocks 106, each of which includes multiple flash memory rows/pages (not shown). In some embodiments, each of the multiple flash memory rows/pages may have a plurality of cells. Additionally or alternatively, the module 104 can comprise or be implemented using a plurality of dies, each of the dies containing a plurality of the blocks 106.

The memory controller 102 may include a read circuit 110, a programming circuit (e.g. a program DSP) 120 and a programming parameter adapter 130. As shown in FIG. 1, the adapter 130 can adapt the programming parameters 122 used by programming circuit 120 as described above. The adapter 130 in this example may include a Program/Erase (P/E) cycle counter 132. Although shown separately for ease of illustration, some or all of the adapter 130 can be incorporated in the programming circuit 120. In some embodiments, the read circuit 110 may include an ICI estimator 111, an ECC decoder 112 and/or a soft information generator 113. In some embodiments, the programming circuit 120 may include an ECC encoder 124. Embodiments of memory controller 102 can include additional or fewer components such as those shown in FIG. 1.

In some embodiments, a flash memory system (e.g., the flash memory system 100 in FIG. 1) may include a cell flash memory (e.g., the flash memory module 104 or a flash memory block 106 in FIG. 1) and a circuit (e.g., the read circuit 110 or the programming circuit 120 in FIG. 1) for performing operations of the plurality of cells. In some embodiments, the flash memory module 104 may have a plurality of cells. In some embodiments, each of the flash memory blocks 106 may have a plurality of cells. In some embodiments, the ICI estimator 111 of the read circuit 110 may be configured to estimate an interference state based on a result of a read operation on a first neighboring cell of a first cell (i.e., a target cell) among the plurality of cells. Embodiments of estimating an interference state will be described below with reference to FIG. 2. In some embodiments, the soft information generator 113 of the read circuit 110 may be configured to generate soft information based on the estimated interference state and a read value from the first cell. Embodiments of generating soft information will be described below with reference to FIG. 3 and FIG. 4. The read circuit 110 may be configured to perform a read operation on the first cell and decode, via the ECC decoder 112, a result of the read operation on the first cell based on the soft information. Embodiments of decoding a result of the read operation will be described below with reference to FIG. 4 to FIG. 7.

In some embodiments, the cell flash memory (e.g., the flash memory module 104 or a flash memory block 106 in FIG. 1) may include rows and columns of the plurality of cells. In some embodiments, a flash memory block 106 may include a plurality of pages (not shown) and a page may be defined as cells linked with the same word line, which correspond to a row of cells. In some embodiments, neighboring cells of a target cell are cells adjacent to the target cell. For example, each of a first neighboring cell and a second neighboring cell (of a first cell) may be positioned at the same column as a column of the first cell and at a row adjacent to a row of the first cell.

Figure 2:
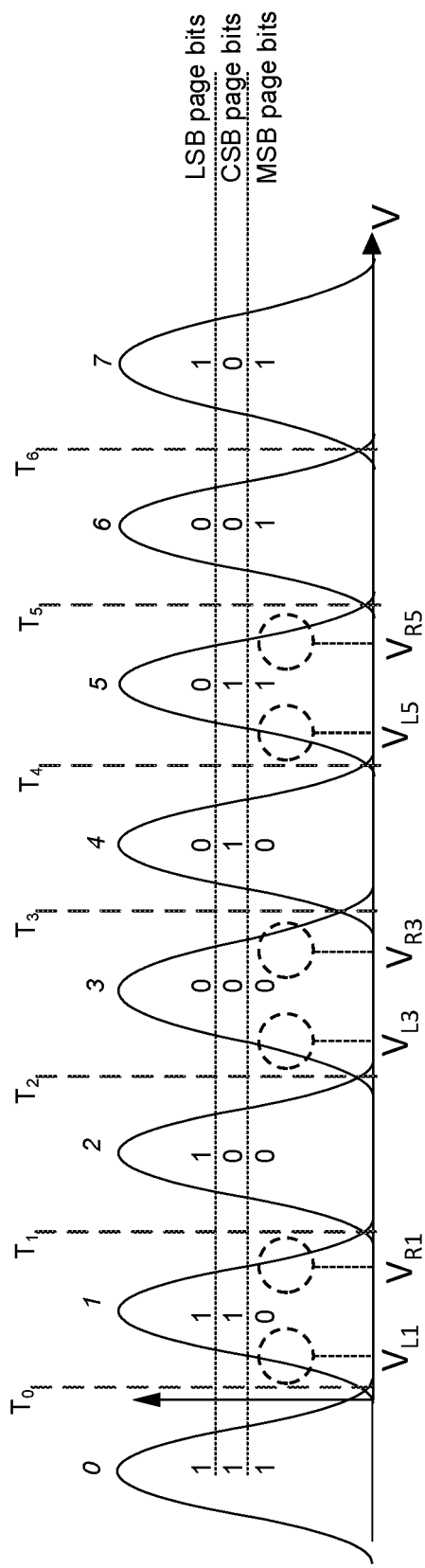
FIG. 2 illustrates threshold voltage distribution in a conventional three bits per cell (bpc) flash device.

Now, embodiments of estimating an interference state will be described with reference to FIG. 2. FIG. 2 illustrates a superposition of the 8 possible voltage threshold distributions of a three bits per cell (bpc) flash memory device. The possible voltage threshold (VT) distributions of the cell have eight lobes, corresponding to the 8 different bit combinations of the three bits represented by the charge state of the cell. An MSB page read requires using thresholds T0, T4, to separate the lobes into those with MSBs of 0 and those with MSBs of 1. For reading CSB pages the read thresholds T1, T3 and T5 are used. For reading LSB pages the read thresholds T2 and T6 have to be used. The lower (left) most distribution is known as the erase level.

Inherent coupling noise between NAND memory cells can be generated from planar or three-dimensional (3D) NAND devices. In planar NAND devices, (1) neighboring cells on the same row and (2) neighboring cells on the same column of adjacent row may be dominant contributors to inter-cell interference (ICI). Thus, reliability gains for hard/soft input can be obtained by estimating the states of neighboring cells. In 3D triple-level cell (TLC) NAND devices, ICI coupling may be found on adjacent word-lines.

The main source of interference may be a programming scheme. For example, during a TLC programming, programming of one row may impact a near-by or adjacent row which is already programmed. The cells which are programmed to highest levels may be the source of a stronger interference (than those programmed to levels lower than the highest levels) which may cause unintentional programming of adjacent cells.

In some embodiments, a statistical dependency modelling of main interference sources and their impact can be characterized. For example, the ICI estimator 111 (see FIG. 1) may be configured to perform a statistical dependency modelling of interference sources and their impact. In some embodiments, a statistical dependency modelling of main interference sources and their impact can be characterized offline in a case where it is difficult to perform such statistical dependency modelling online because of different programming schemes of different NAND devices. For example, the programming scheme of one generation of NAND devices may be different from that of another generation of NAND devices. In some embodiments, the ICI estimator 111 (see FIG. 1) may perform a statistical dependency modelling of interference sources and their impact offline. In some embodiments, to perform such statistical dependency modelling offline for a target NAND device, the ICI estimator 111 or the computing system may store, in memory (e.g., in a mass storage device connected to an I/O (USB, IEEE1394, Small Computer System Interface (SCSI), Serial Advanced Technology Attachment (SATA), Serial Attached SCSI (SAS), PCI Express (PCIe) etc.), information on the programming scheme of the target NAND device so that it can accurately model the interference sources and their impact in the target NAND device.

Figure 3:
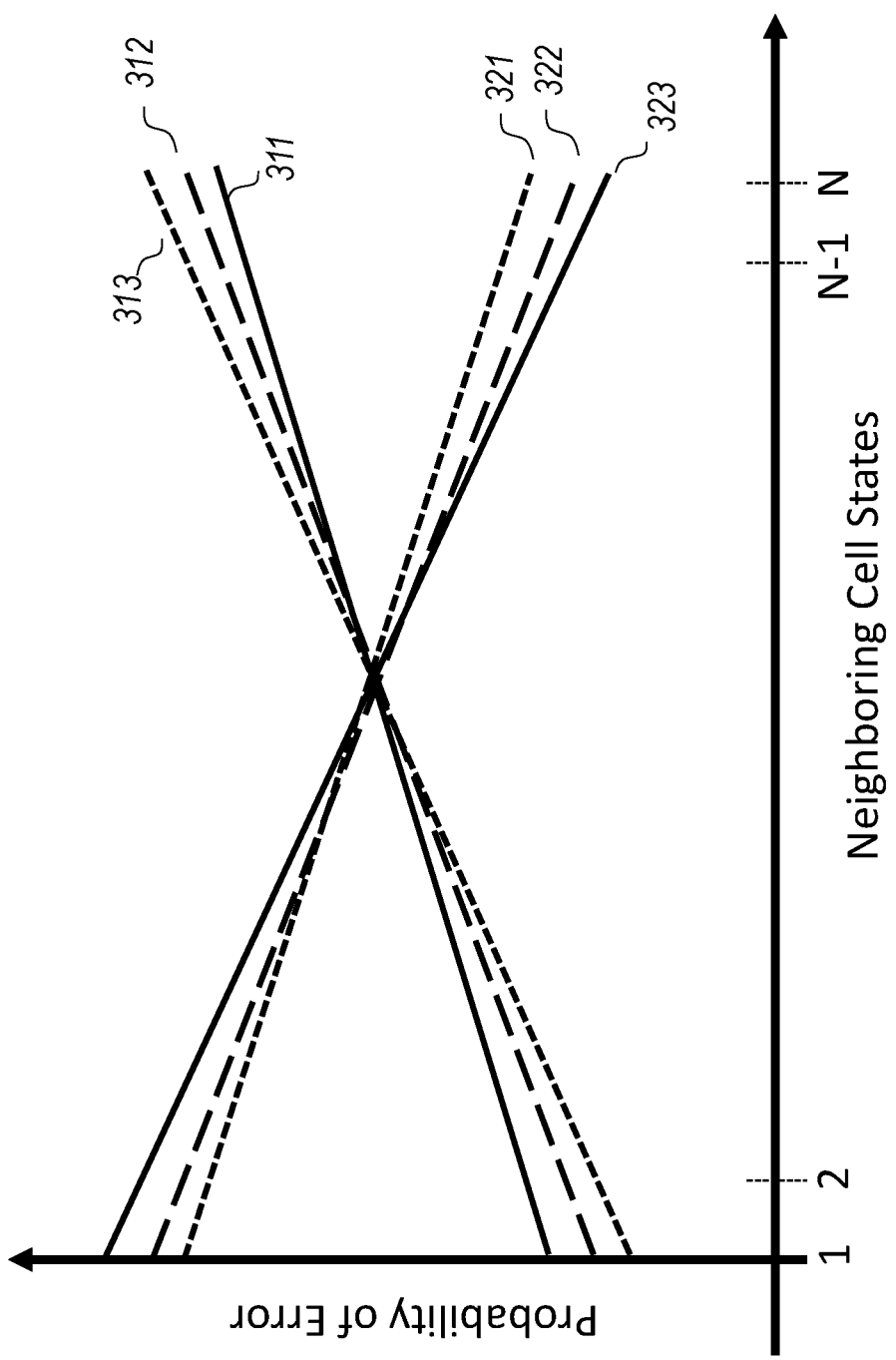
FIG. 3 is a diagram illustrating an example aspect of computing an error probability given states of neighboring cells in a flash memory device using example methodologies according to some embodiments.

In some embodiments, once interference sources and their impact are modeled or identified, simple signal processing operations can be performed to compensate for or decouple the interference. For example, sampling results of a target page can be post-processed to compensate for or decouple the interference. In some embodiments, reliability information for reading or decoding of a target page can be provided. For example, the soft information generator 113 of the read circuit 110 (see FIG. 1) may be configured to generate reliability information (e.g., calculating a probability of error as shown in FIG. 3) and provide soft information (e.g., information shown in FIG. 4) based on the reliability information. Embodiments of generating soft information will be described in more detail below with reference to FIG. 4.

In some embodiments, the circuit (e.g., the ICI estimator 111 of the read circuit 110 in FIG. 1) may be configured to estimate an interference state based on a result of a read operation on a first neighboring cell of a first cell (i.e., a target cell) among the plurality of cells. More particularly, in some embodiments, in estimating the interference state, the circuit may be further configured to estimate a level at which the first neighboring cell is programmed. For example, the ICI estimator 111 may estimate, based on a result of a read operation on the first neighboring cell, a level at which the first neighboring cell is programmed. The ICI estimator 111 may then estimate an interference state of the first neighboring cell based on the estimated programmed level of the first neighboring cell. In some embodiments, the interference state of a neighboring cell is an estimated programmed level of the neighboring cell.

In estimating the interference state, the circuit (e.g., the ICI estimator 111) may be further configured to obtain the result of the read operation on the first neighboring cell from pre-fetch of a next page read or by saving a previous read result. For example, in estimating the interference state for a target cell in a target page, the ICI estimator 111 may obtain a read result of a neighboring cell (of the target cell) in a next page that is to be read next to the target page, by pre-fetching the read result of the next page. In some embodiments, the ICI estimator 111 may obtain a read result of a neighboring cell (of the target cell) in a previous page that has been read prior to the target page, by saving and reusing the read result of the previous page. In this manner, in some embodiments, the circuit may be configured to estimate interference states for decoding results of read operations on the plurality of cells by reading the rows of the plurality of cells sequentially and only once. For example, when rows #1, #2 and #3 are sequentially read, for estimating an interference state for a target cell in the row #1, a read result of the row #2 can be pre-fetched, and for estimating an interference state for a target cell in the row #2, a read result of the row #3 can be pre-fetched and a read result of the row #1 which was saved in memory can be reused, thereby allowing the rows #1, #2, #3 to be read sequentially and only once.

In some embodiments, the interfere state for a target cell may be analyzed and modeled as function of one or more cells adjacent to the target cell. In some embodiments, to analyze the contribution of interference of each neighboring cell, a single neighboring row state estimation may be performed without need of decoding. For example, the ICI estimator 111 (see FIG. 1) can estimate the interference state of a neighboring row from a hard read before decoding. In some embodiments, the ICI estimator 111 can estimate the interference state of a neighboring row post decoding as true data.

In some embodiments, the ICI estimator 111 may estimate the inference state of a neighboring cell from a distribution of state (or level) programmed in the neighboring cell. For example, with randomly programmed data to a NAND cell that can be programmed up to N levels (N=8 for TLC), the distribution of state in a neighboring cell, e.g., a neighboring cell in the next row, may be uniform. That is, the probability density of the estimated state x of the neighboring cell may be given by $$pdf(x) = \begin{cases} \dfrac{1}{N} & 1 \le x \le N \\ 0 & \text{else} \end{cases} \quad \text{(Equation 1)}$$

In some embodiments, in estimating an interference state for a first cell (i.e., the target cell), the circuit (e.g., the ICI estimator 111 in FIG. 1) may be configured to estimate, based on a result of read operations on first and second neighboring cells of the first cell, a combined programmed level of the first neighboring cell and the second neighboring cell. In some embodiments, the interference state of two neighboring cells can be estimated from a hard read (from the two neighboring cells) before decoding. In some embodiments, the interference state of two neighboring cells can be estimated post decoding as true data.

In some embodiments, the circuit may be configured to calculate a sum of states of neighboring rows of a target row, e.g., two adjacent rows before and after target row. In some embodiments, the circuit may be configured to calculate a sum of states of neighboring cells (of a target cell) in the same row as the row of the target cell. Calculation of the sum of states (e.g., programming levels) of neighboring rows or neighboring cells can capture the natural impact of interference which is unintentional programming with respect to a level of the target row or cell. The higher the programming levels of neighboring rows or cells are, the stronger the unintentional programming effect on the target row or cell is. In cases that there are two sources of interference with a target (e.g., a target cell or row), due to programming order or lack of isolation for two neighbors (e.g., two neighboring cells or rows), the sum of states of the two neighbors may be a good indication of the amount of additional programming (or interference) to a target cell.

In some embodiments, in estimating the interference state of a first neighboring cell and a second neighboring cell (of the target cell), the circuit (e.g., the ICI estimator 111 in FIG. 1) may be configured to calculate a probability density of a sum of two uniform random variables indicating programmed levels of the first neighboring cell and the second neighboring cell, respectively. For example, with randomly programmed data to a NAND cell that can be programmed up to N levels (N=8 for TLC), the distribution of sum-of-states x of two neighboring cells, e.g., two neighboring cells in the next row, may be estimated by calculating the probability density of sum-of-states x. In some embodiments, the probability density of sum-of-states x of two neighboring cells may be given by the following general pdf of a partial sum of two uniform random variables (RVs) each with N states:

$$pdf(x) = \begin{cases} \dfrac{(x-1)}{N^2} & 2 \leq x \leq N+1 \\ \dfrac{(2N+1-x)}{N^2} & N+1 < x \leq 2N \\ 0 & \text{else} \end{cases} \quad \text{(Equation 2)}$$

In some embodiments, after estimating the interference state of a neighbor or neighbors of a target (e.g., cell or row), an error probability of the target over, or as a function of, the estimated interference state may be computed based on an empirical distribution by offline characterization of a NAND family of devices. In some embodiments, the error probability of the target as a function of the estimated interference state may be a per-bit error probability as a function of the estimated interference state. In some embodiments, the full statistical characteristics of conditional error probabilities may be computed from a large collection of voltage threshold (VT) distributions of many devices (e.g., the VT distributions of a three bpc flash memory device as shown in FIG. 2) and on different stress conditions. In some embodiments, a single set of empirical distribution can be computed or characterized offline and later adjusted compensated for under all stress conditions (e.g., when the coupling noise is added during programming). In some embodiments, calculation of such conditional error probabilities based on empirical distributions can be performed by the ICI estimator 111 of the read circuit 110 (see FIG. 1).

Now, embodiments of generating soft information will be described with reference to FIG. 3 and FIG. 4. FIG. 3 is a diagram illustrating an example aspect of computing conditional error probability given states of neighboring cells in a flash memory device using example methodologies according to some embodiments. Assuming, for example, the next row (e.g., a row to be read next to the target row) as a dominant interference contributor, the x-axis in FIG. 3 is the states of neighboring cells of a target cell in the next row, which is 1, . . . , N where N is the number of levels that can be programmed to a cell, for example, N=8 for a TLC device. The y-axis is the probability of unidirectional error for a given threshold voltage of the target cell (e.g., threshold voltages $V_{L1}$, $V_{R1}$, $V_{L3}$, $V_{R3}$, $V_{L5}$, or $V_{R5}$ in FIG. 2).

In FIG. 3, lines 311, 312, 313 represent the probability of unidirectional errors over neighboring cell states for threshold voltages in right tail lobes, $V_{R1}$, $V_{R3}$, and $V_{R5}$ (see FIG. 2), respectively. These right lobe tail errors (as represented by the lines 311, 312, 313), as side information of interfering cells or cell interference side information, are unidirectional errors of over-programming, i.e., a cell programmed to state (or level) j is decoded as state (or level) j+1. From FIG. 3, it is observed that there is higher probability of error for on the right lobe tails (see the lines 311, 312, 313), when the neighboring cell is programmed to a higher level, while having a lowest probability of error in case the neighboring cells are on erase, i.e., programmed to the lowest level (state "1" in FIG. 3). Based on the observation, in some embodiments, the circuit (e.g., the soft information generator 113 in FIG. 1) may map, for a first interference state (e.g., state "N" in FIG. 3) indicating a higher programmed level of a neighboring cell than a second interference state (e.g., state "N−1" in FIG. 3), a right lobe tail of a threshold voltage distribution of a target cell to a first decoding error that is higher than a second decoding error mapped from the right lobe tail for the second interference state (e.g., state "N−1" in FIG. 3).

On the other hand, lines 321, 322, 323 represent the probability of unidirectional errors over neighboring cell states for threshold voltages in left tail lobes, $V_{L1}$, $V_{L3}$, and $V_{L5}$ (see FIG. 2), respectively. These left lobe tail errors (as represented by the lines 321, 322, 323), as side information of interfering cells or cell interference side information, are unidirectional errors of under-programming, i.e., a cell programmed to state (or level) j is decoded as state (or level) j−1. From FIG. 3, it is observed that there is lower probability of error for on the left lobe tails (see the lines 321, 322, 323), when the neighboring cell is programmed to a higher level, while having a highest probability of error in case the neighboring cells are on erase, i.e., programmed to the lowest level (state "1" in FIG. 3). Based on the observation, in some embodiments, the circuit (e.g., the soft information generator 113 in FIG. 1) may map, for a third interference state (e.g., state "2" in FIG. 3) indicating a higher programmed level of the first neighboring cell than a fourth interference state (e.g., state "1" in FIG. 3), a left lobe tail of the threshold voltage distribution of the target cell to a third decoding error that is lower than a fourth decoding error mapped from the left lobe tail for the fourth interference state (e.g., state "1" in FIG. 3).

In some embodiments, the circuit (e.g., the soft information generator 113) may compute the probability of error for right and left lobe tails as function of state of a dominant interference cell, or as function of a combination of states of interference cells, such as sum of states. In some embodiments, the circuit may compute the probability of error for a hard read from the target cell, given the interference state, as function of state of a dominant interference cell, or as function of a combination of states of interference cells, such as sum of states. In some embodiments, after computing the probability of error for a hard read given the interference state, a memory controller (e.g., the memory controller 102 in FIG. 1) may perform, within a controller read-flow, hard reads which are accompanied by hard reads of interference, and use results of the hard reads to compute soft information as a decoder input. In some embodiments, using soft-information, the decoder (e.g., the ECC decoder 112 in FIG. 1) can correct more errors, thereby achieving higher endurance and higher stress resilience of a NAND controller.

In some embodiments, the circuit (e.g., the soft information generator 113 of the read circuit 110) may be configured to generate soft information based on a read value from the first cell (i.e., the target cell) and the estimated interference state (e.g., the estimated interference state of neighboring cell(s)). In some embodiments, in generating the soft information, the circuit (e.g., the soft information generator 113) may compute an error probability of decoding the result of the read operation on the first cell over (as a function of) the estimated interference state (e.g., the probability of error over, or as a function of, the neighboring cell states as shown in FIG. 3). In some embodiments, the soft information may indicate decoding errors due to the interference state.

FIG. 4 is a table illustrating an example aspect of mapping of hard bit and interference information into soft information in a flash memory device using example methodologies according to some embodiments.

In some embodiments, the soft information may be directly mapped from a hard read value and an estimated interference state. In some embodiments, the soft information may be log-likelihood ratio (LLR) values which are mapped from a hard read value and one of four state interference values (e.g., 1, 2, −1, and −2; see values in the column "Estimated Interference State" in FIG. 4). In some embodiments, a state interference value among the set of (1, 2, −1, and −2) can be determined based on (1) an estimated state of neighboring cell(s) and (2) side information of interfering cells (or cell interference side information), e.g., whether the estimated state of neighboring cell(s) impacts a threshold voltage of the target cell in a right lobe tail or a left lobe tail. For example, a higher state of neighboring cell(s) (e.g., "N−1" in FIG. 3) may increase the probability of hard read errors on the right lobe tail voltages (e.g., voltages represented by the lines 311, 312, 313). Because such increased error probability in the right lobe tail voltages represent over-programming of a true level, a positive state interference value (e.g., 1 or 2) may be assigned to the state "N−1" and may be used to assign probability of over-programming. A lower state of neighboring cell(s) (e.g., "2" in FIG. 3) the over-programming probability on right tail is low, and also their probability of being in error state is low. Similarly, a lower state neighboring cell(s) may increase the read error probability in the left lobe tail voltages (e.g., voltages represented by the lines 321, 322, 323). Because such increased error probability in the left lobe tail voltages represent under-programming of a true level, the low state of a neighboring cell may correspond to high probability of read error (on left tail direction) for these cells.

More particularly, referring to FIG. 4, in some embodiments, in generating the soft information, the circuit (e.g., the soft information generator 113 in FIG. 1) may map a pair of (1) a hard bit read value (e.g., values in the column "Hard Bit" in FIG. 4) of a bit represented by the first cell (e.g., the target cell) as a result of read operation on the target cell and (2) an interference state of the first neighboring cell (e.g., values in the column "Estimated Interference State" in FIG. 4) to a log-likelihood ratio (LLR) value as the soft information (e.g., values in the column "LLR Value for decoder" in FIG. 4).

In some embodiments, the LLR values in the table in FIG. 4 may represent a certainty of a hard bit read value. In some embodiments, the conditional LLR value of hard bit read value b=0, which depends on the interference state I, can be defined by $$LLR1(b\mid I) = \log\left(\frac{P(b=1\mid I)}{P(b=0\mid I)}\right) \quad \text{(Equation 3)}$$

The conditional error probability LLR1(b|I) can be used to generate LLR values for hard bit read value "0" given the estimated interference state ("−2", "−1", "1", "2"), as shown in the first four rows in the table in FIG. 4.

Similarly, the conditional LLR value of hard bit read value b=1, which depends on the interference state I, can be defined by $$LLR2(b\mid I) = \log\left(\frac{P(b=0\mid I)}{P(b=1\mid I)}\right) \quad \text{(Equation 4)}$$

The conditional error probability LLR2(b|I) can be used to generate LLR values for hard bit read value "1" given the estimated interference state ("−2", "−1", "1", "2"), as shown in the last four rows in the table in FIG. 4.

In some embodiments, the probability P(b=0|I) or P(b=1|I) may be obtained by offline characterization of a NAND device, based on its programming scheme. In some embodiments, because interference characteristics is device-dependent characteristics, calculation of the probability P(b=0|I) or P(b=1|I) based on offline characterization of NAND devices may be performed once for a device family. In some embodiments, after calculating the initial probability P(b=0|I) or P(b=1|I), sampling the interference may be performed to update the probability P(b=0|I) or P(b=1|I) (for example, a coarse estimation without decoding is enough), and then the conditional probability of error LLR1(b|I) or LLR2(b|I) may be updated and assigned as soft information, as shown in the table in FIG. 4.

Figure 5:
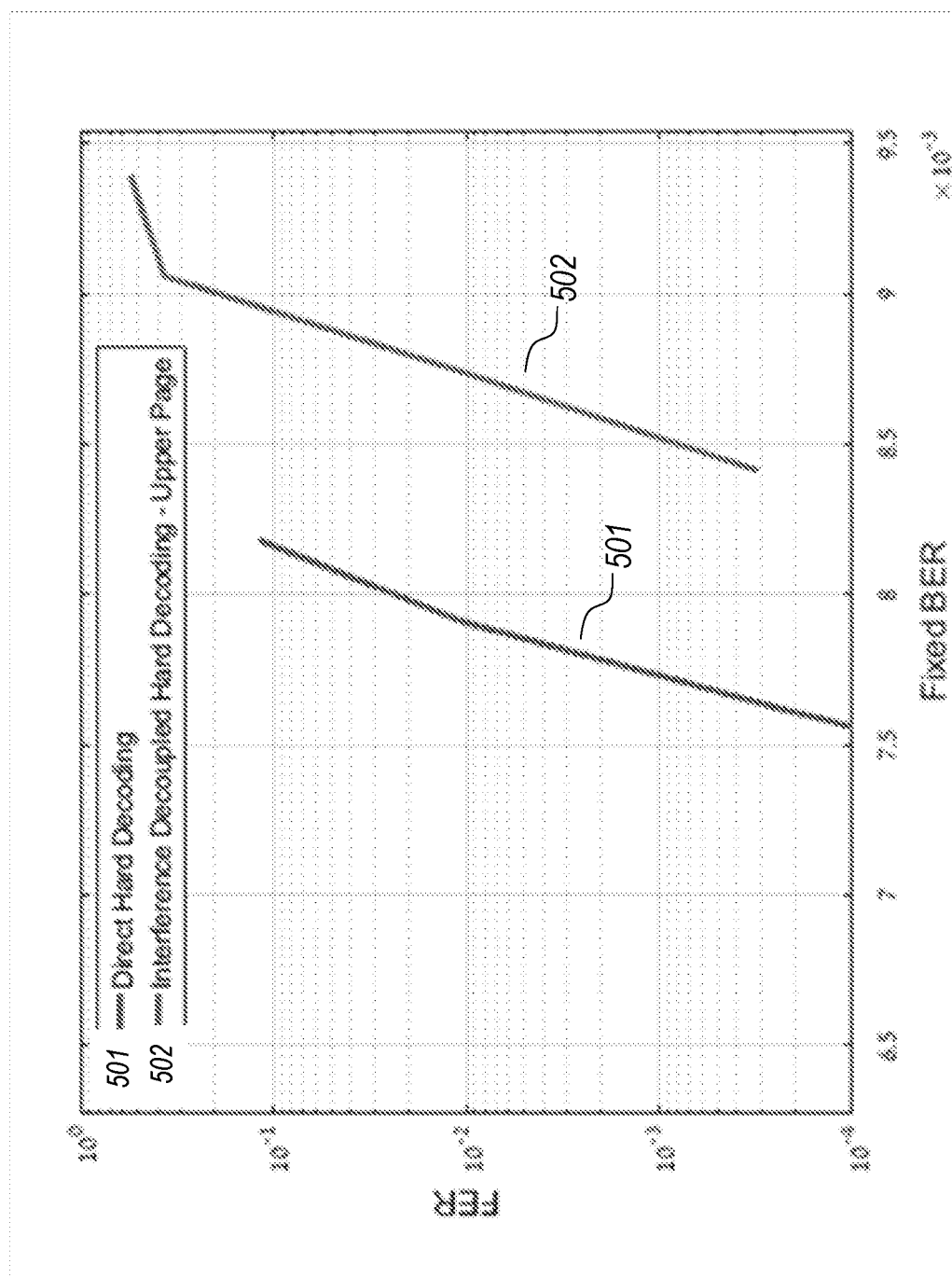
FIG. 5 is a diagram illustrating an example result of comparing hard-read decoding capability with interference information and hard-read decoding capability without interference information, according to some embodiments.

FIG. 5 is a diagram illustrating an example result of comparing hard-read decoding capability with interference information and hard-read decoding capability without interference information, according to some embodiments. The x-axis in FIG. 5 is a fixed bit error rate (BER) used in a hard-read decoding, and the y-axis is a corresponding frame error rate (FER). FIG. 5 shows an exemplary decoding results for hard reads when decoding of a 4 KB codeword at code rate 0.9, where the "direct hard decoding" (curve 501) refers to the case that hard reads are performed on a target page without taking into account the impact of neighboring cells interference, and the "interference decoupled hard decoding" (curve 502) represents the case of hard-reads decoding capability with available side information of interference per bit. The graph in FIG. 5 shows that if applying pre-fetch of a next codeword or reuse of saved results of already read neighboring pages, depending on the interference model, and generating soft information based on estimated interference, then a decoder can effectively use the soft information as decoder input, even though the target codeword was obtained by a single read. This result shows that the exemplary methods of estimating interference and generating soft information as described above in the present disclosure can efficiently and accurately decode a target codeword without performing multiple reads of the target cell or row. That is, FIG. 5 demonstrates that the exemplary methods described in the present disclosure can achieve reliability gain.

Figure 6:
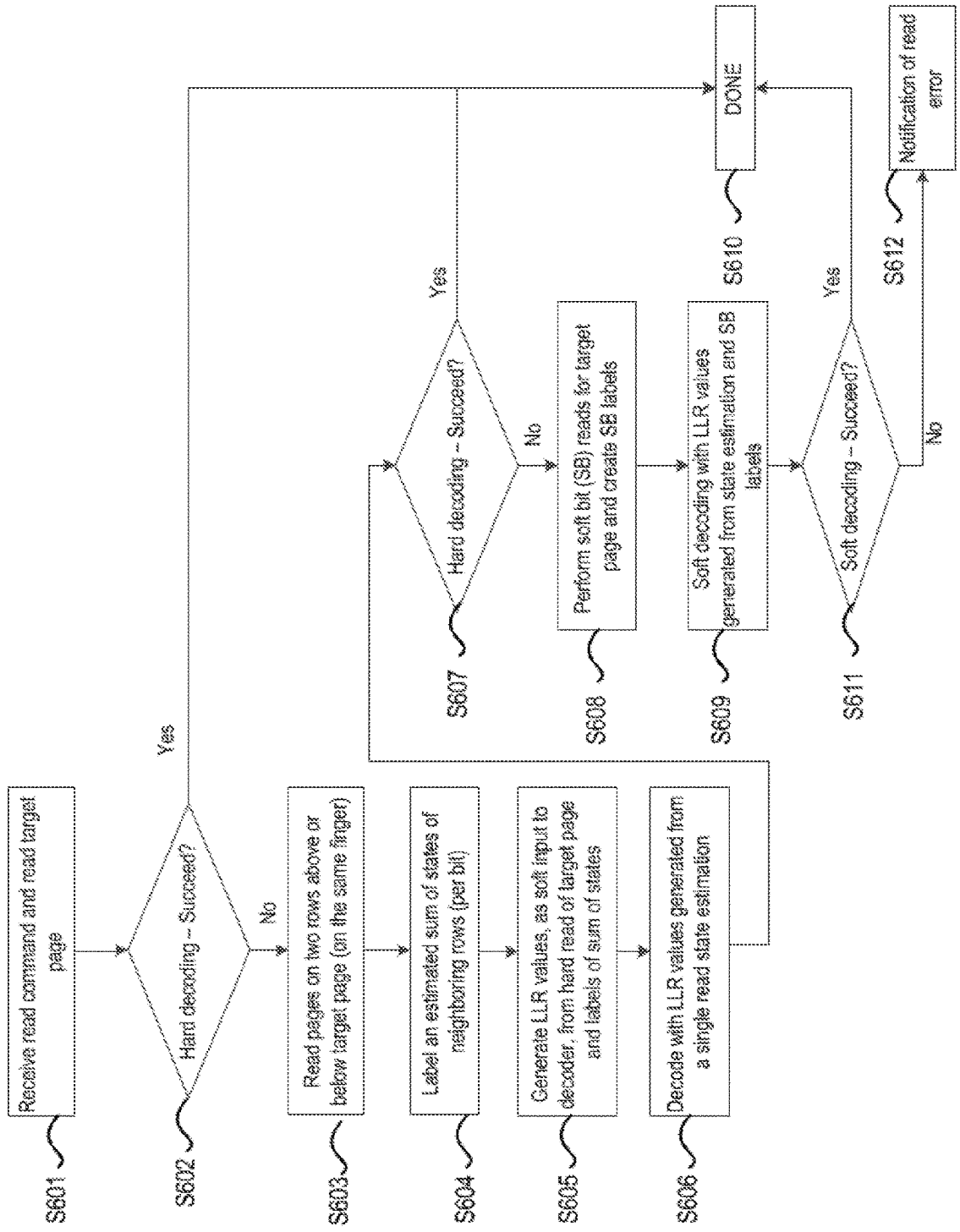
FIG. 6 is a flowchart illustrating an example methodology for performing read operations using interference information in a flash memory device according to some embodiments.

FIG. 6 is an example methodology for performing read operations using interference information in a flash memory device according to some embodiments.

In this example, the process begins in step S601 by performing, upon receipt of a read command to read a target page, a read operation on the target page and attempting to perform a hard decoding of the read result of the target page. In some embodiments, the read command can be received in a random manner or at an arbitrary time.

In step S602, it may be determined whether the hard decoding of a read result of the target page succeeds or not. If the hard decoding fails, e.g., due to a high error rate, the process may proceed to step S603. Otherwise, if the hard decoding succeeds, the process will end at step S610.

In step S603, a read result of a previous row (e.g., a row above the row of the target page) which has been read prior to the target page may be reused. In some embodiments, an additional read or reads of a next row (e.g., a row below the row of the target page) may be performed (i.e., a next page is pre-fetched). In some embodiments, information stored on the same finger or lobe (see FIG. 2) as the target page may be reused or pre-fetched.

In step S604, from the read results of the previous row and the next row, a combined state of neighboring rows may be estimated. In some embodiments, a sum of states of the neighboring rows may be calculated to estimate the combined state. In some embodiments, the estimated state of neighboring row(s) may be labeled as a value (e.g., values in the column "Estimated Interference State" in FIG. 4) based on side information of interfering cells in the neighboring rows (e.g., right lobe tail errors or left lobe tail errors; see FIG. 3). In some embodiments, an estimated sum of states of neighboring rows (per bit) may be labeled as a value indicating a decoding error of decoding a target codeword.

In step S605, soft information (e.g., values in the column "LLR Values for decoder" in FIG. 4) may be generated as a decoder input. In some embodiments, the soft information may be in the form of LLR values. In some embodiments, the LLR values may be generated from a single read state estimation, i.e., estimation based on a single read of each neighboring row. In some embodiments, a pair of a value of hard bit read of the target page (e.g., values in the column "Hard Bit" in FIG. 4) and a label of sum of states of neighboring rows (e.g., values in the column "Estimated Interference State" in FIG. 4) may be mapped to an LLR value (e.g., values in the column "LLR Values for decoder" in FIG. 4) as soft input to decoder.

In step S606, a decoder (e.g., the ECC decoder 112 in FIG. 1) may decode a read result of the target page with the soft information generated in step S605. In some embodiments, the decoder may decode the read result of the target page with LLR values (e.g., values in the column "LLR Values for decoder" in FIG. 4) that are generated from a single read state estimation, i.e., estimation based on a single read of each neighboring row.

In step S607, a hard decoding may be attempted again and if the hard decoding fails again, e.g., due to a high error rate, the process may proceed to step S608. Otherwise, if the hard decoding succeeds, the process will end at step S610.

In step S608, soft bit (SB) reads for the target page may be performed using different voltage thresholds from those used in hard bit (HB) reads. In some embodiments, an estimated state of neighboring row(s) may be labeled (SB labels) as a value based on side information of interfering cells and the result of the SB reads (e.g., whether the estimated state increases right lobe tail errors or left lobe tail errors in the threshold voltage distribution of the target page). In some embodiments, an LLR value as input to the decoder (e.g., the ECC decoder 112 in FIG. 1) may be generated and mapped from a pair of a value of soft bit read of the target page and a label of sum of states of neighboring rows.

In step S609, the decoder may decode the SB read result of the target page with the soft information generated in step S608, i.e., the LLR values generated based on side information of interfering cells and the result of the SB reads.

In step S611, a soft decoding may be attempted and if the soft decoding fails, e.g., due to a high error rate, the process may proceed to step S612. Otherwise, if the soft decoding succeeds, the process will end at step S610.

In step S612, a read error may be generated by a read circuit (e.g., the read circuit 110 in FIG. 1) so that the memory controller (e.g., the memory controller 102) is notified of the read error.

The main benefit in the read-flow as shown in FIG. 6 is the fact that during sequential reads, the controller (e.g., the memory controller 102) can compute soft information without performing any excess reads, as every pre-fetch of pages which is used for computation of soft information, can be later used for decoding within the sequential read operation. The method described in the present disclosure can allow for performing large sequential reads with a single read of the target page, thereby efficiently achieving higher endurance and higher BER by means of the utilization of interference for computation of soft information.

Figure 7:
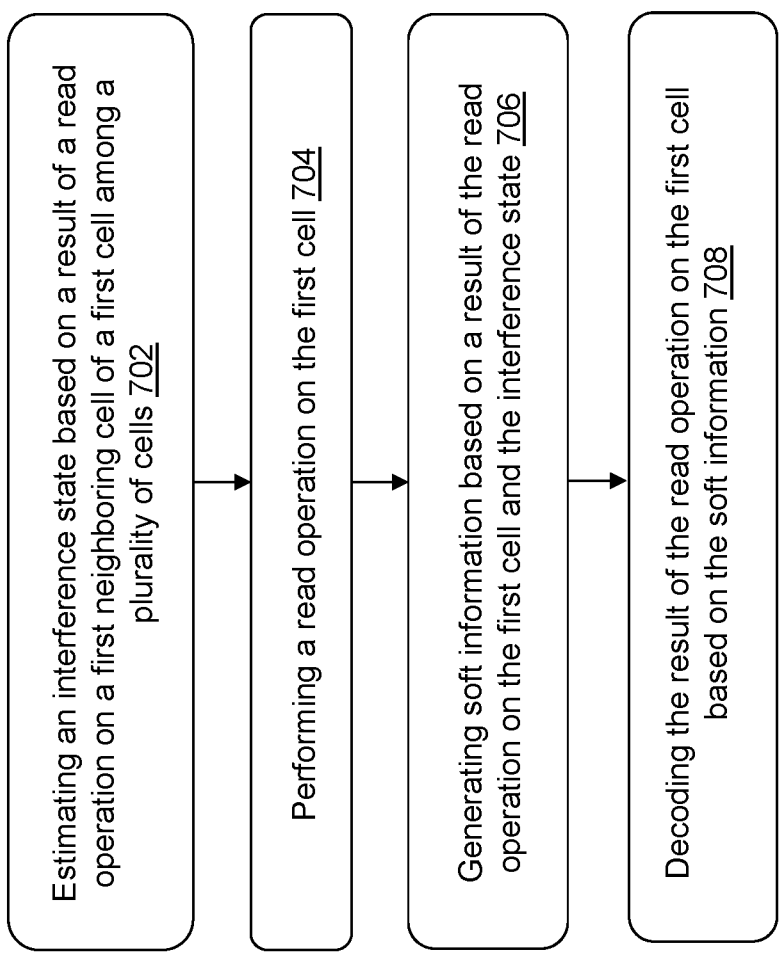
FIG. 7 is a flowchart illustrating an example methodology for decoding results of read operations using interference information in a flash memory device according to some embodiments.

FIG. 7 is a flowchart illustrating an example methodology for decoding results of read operations using interference information in a flash memory device according to some embodiments. More particularly, another example method for decoding results of read operations using interference information, similar to steps S604-S606 in FIG. 6 will be described in connection with the flowchart of FIG. 7.

In this example, the process begins in step S702 by estimating an interference state based on a result of a read operation on a first neighboring cell of a first cell (i.e., the target cell) among the plurality of cells in a cell flash memory (e.g., the flash memory module 104 in FIG. 1). In some embodiments, the cell flash memory may include rows and columns of the plurality of cells. Each of neighboring cells (e.g., the first neighboring cell and the second neighboring cell) may be positioned at the same column as a column of the first cell (i.e., the target cell) and at a row adjacent to a row of the first cell. In some embodiments, in estimating the interference state, the result of the read operation on the first neighboring cell may be obtained from pre-fetch of a next page read (e.g., a page to be read next to the target page in a sequential read operation) or by saving and reusing a previous read result (e.g., a page that has been read prior to the target page). In some embodiments, the interference state may be estimated based on the obtained read operation result, e.g., a read result by pre-fetch of the next page read or reuse of the previous page read. In some embodiments, the interference states for decoding results of read operations on the plurality of cells may be estimated by reading the rows of the plurality of cells sequentially and only once, e.g., by means of a read result obtained by pre-fetch of the next page read or reuse of the previous page read.

In some embodiments, in estimating the interference state, a level at which the first neighboring cell is programmed may be estimated. For example, the level or state programmed to the first neighboring cell may be estimated using the Equation (1). In some embodiments, in estimating the interference state, the interference state may be estimated based on a result of a read operation on a second neighboring cell of the first cell (e.g., the target cell) by estimating a combined programmed level of the first neighboring cell and the second neighboring cell. For example, the combined level or state of the first and second neighboring cells may be estimated using the Equation (2). In some embodiments, in estimating the interference state as the combined level or state of the first and second neighboring cells, a probability density of a sum (e.g., sum-of-states x in Equation (2)) of two uniform random variables indicating programmed levels (e.g., 1 to N in Equation (2)) of the first neighboring cell and the second neighboring cell, respectively, may be calculated.

In step 704, a read operation on the first cell (i.e., the target cell) may be performed. In some embodiments, upon receipt of a read command to read the first cell, a read operation on the first cell may be performed.

In step S706, soft information (e.g., values in the column "LLR Values for decoder" in FIG. 4) may be generated based on a read value from the first cell (e.g., the target cell) as a result of the read operation on the first cell and the interference state estimated in step S702. In some embodiments, in generating the soft information, a conditional error probability of decoding the result of the read operation on the first cell given the estimated interference state (e.g., the conditional error probability LLR1(b|I) in Equation (3) and the conditional error probability LLR2(b|I) in Equation (4)) may be computed. In some embodiments, the soft information may indicate decoding errors due to the interference state. In some embodiments, in generating the soft information, for a first interference state (e.g., the state "N" in FIG. 3) indicating a higher programmed level of the first neighboring cell than a second interference state (e.g., the state "N-1" in FIG. 3), a right lobe tail (e.g., $V_{R1}$, $V_{R3}$, and $V_{R5}$ in FIG. 2) of a threshold voltage distribution of the target cell of the cell flash memory may be mapped to a first decoding error that is higher than a second decoding error mapped from the right lobe tail for the second interference state (see the mappings represented by the lines 311, 312, 313 in FIG. 3). For a third interference state (e.g., the state "2" in FIG. 3) indicating a higher programmed level of the first neighboring cell than a fourth interference state (e.g., the state "1" in FIG. 3), a left lobe tail (e.g., $V_{L1}$, $V_{L3}$, and $V_{L5}$ in FIG. 2) of the threshold voltage distribution of the cell may be mapped to a third decoding error that is lower than a fourth decoding error mapped from the left lobe tail for the fourth interference state (see the mappings represented by the lines 321, 322, 323 in FIG. 3).

In some embodiments, in generating the soft information, a pair of (1) a read value (e.g., values in the column "Hard Bit" in FIG. 4) of a bit represented by the first cell as a result of a read operation on the first cell and (2) an interference state of the first neighboring cell (e.g., values in the column "Estimated Interference State" in FIG. 4) may be mapped to a log-likelihood ratio (LLR) as the soft information (e.g., values in the column "LLR Values for decoder" in FIG. 4).

In step S708, a result of the read operation on the first cell may be decoded based on the soft information. In some embodiments, a decoder (e.g., the ECC decoder 112 in FIG. 1) may decode a read result of the first cell with the soft information generated in step S704. In some embodiments, the decoder may decode the read result of the first cell with LLR values (e.g., values in the column "LLR Values for decoder" in FIG. 4) that are generated from a single read state estimation, i.e., estimation based on a single read of each neighboring row. In some embodiments, the decoder may decode the read result of the first cell with LLR values that are mapped from a pair of a value of hard bit read of the target cell (e.g., values in the column "Hard Bit" in FIG. 4) and a label of an estimated state of neighboring cells (e.g., values in the column "Estimated Interference State" in FIG. 4).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for performing operations of a plurality of cells of a cell flash memory, the method comprising:
    estimating an interference state based on a result of a read operation on a first neighboring cell of a first cell among the plurality of cells;
    performing a read operation on the first cell;
    generating soft information based on a result of the read operation and the interference state; and
    decoding the result of the read operation on the first cell based on the soft information.

2. The method of claim 1, wherein the generating the soft information includes:
    computing a conditional error probability of decoding the result of the read operation on the first cell given the estimated interference state.

3. The method of claim 1, wherein the estimating the interference state includes:
    estimating a level at which the first neighboring cell is programmed.

4. The method of claim 3, wherein:
    the soft information indicates a per-bit error probability as function of the interference state, and
    the generating the soft information includes:
        for a first interference state indicating a higher programmed level of the first neighboring cell than a second interference state, mapping a right lobe tail of a threshold voltage distribution of a cell of the cell flash memory to a first decoding error that is higher than a second decoding error mapped from the right lobe tail for the second interference state; and
        for a third interference state indicating a higher programmed level of the first neighboring cell than a fourth interference state, mapping a left lobe tail of the threshold voltage distribution of the cell to a third decoding error that is lower than a fourth decoding error mapped from the left lobe tail for the fourth interference state.

5. The method of claim 1, wherein the generating the soft information includes:
    mapping a pair of (1) a read value of a bit represented by the first cell as the result of the read operation and (2) the estimated interference state of the first neighboring cell to a log-likelihood ratio (LLR) as the soft information.

6. The method of claim 1, wherein the estimating the interference state includes:
    estimating the interference state based on a result of a read operation on a second neighboring cell of the first cell by estimating a combined programmed level of the first neighboring cell and the second neighboring cell.

7. The method of claim 6, wherein:
    the cell flash memory includes rows and columns of the plurality of cells, and
    each of the first neighboring cell and the second neighboring cell is positioned at the same column as a column of the first cell and at a row adjacent to a row of the first cell.

8. The method of claim 7, wherein interference states for decoding results of read operations on the plurality of cells are estimated by reading the rows of the plurality of cells sequentially and only once.

9. The method of claim 6, wherein the estimating the interference state further includes:
calculating a probability density of a sum of two uniform random variables indicating programmed levels of the first neighboring cell and the second neighboring cell, respectively.

10. A method for performing operations of a plurality of cells of a cell flash memory, the method comprising:
estimating an interference state based on a result of a read operation on a first neighboring cell of a first cell among the plurality of cells;
performing a read operation on the first cell;
generating soft information based on a result of the read operation and the interference state; and
decoding the result of the read operation on the first cell based on the soft information,
wherein the estimating the interference state includes:
obtaining the result of the read operation on the first neighboring cell from pre-fetch of a next page read or by saving a previous read result; and
estimating the interference state based on the read operation result obtained from the pre-fetch of the next page read or by saving the previous read result.

11. A flash memory system comprising:
a cell flash memory having a plurality of cells; and
a circuit for performing operations of the plurality of cells, the circuit being configured to:
estimate an interference state based on a result of a read operation on a first neighboring cell of a first cell among the plurality of cells;
perform a read operation on the first cell;
generate soft information based on a result of the read operation and the interference state; and
decode the result of the read operation on the first cell based on the soft information.

12. The flash memory system of claim 11, wherein in estimating the interference state, the circuit is further configured to:
obtain the result of the read operation on the first neighboring cell from pre-fetch of a next page read or by saving a previous read result; and
estimate the interference state based on the read operation result obtained from the pre-fetch of the next page read or by saving the previous read result.

13. The flash memory system of claim 11, wherein in generating the soft information, the circuit is further configured to:
compute a conditional error probability of decoding the result of the read operation on the first cell given the estimated interference state.

14. The flash memory system of claim 11, wherein in estimating the interference state, the circuit is further configured to:
estimate a level at which the first neighboring cell is programmed.

15. The flash memory system of claim 14, wherein:
the soft information indicates a per-bit error probability as function of the interference state, and
in generating the soft information, the circuit is further configured to:
for a first interference state indicating a higher programmed level of the first neighboring cell than a second interference state, map a right lobe tail of a threshold voltage distribution of a cell of the cell flash memory to a first decoding error that is higher than a second decoding error mapped from the right lobe tail for the second interference state; and
for a third interference state indicating a higher programmed level of the first neighboring cell than a fourth interference state, map a left lobe tail of the threshold voltage distribution of the cell to a third decoding error that is lower than a fourth decoding error mapped from the left lobe tail for the fourth interference state.

16. The flash memory system of claim 11, wherein in generating the soft information, the circuit is further configured to:
map a pair of (1) a read value of a bit represented by the first cell as the result of the read operation and (2) the estimated interference state of the first neighboring cell to a log-likelihood ratio (LLR) as the soft information.

17. The flash memory system of claim 11, wherein in estimating the interference state, the circuit is further configured to:
estimate the interference state based on a result of a read operation on a second neighboring cell of the first cell by estimating a combined programmed level of the first neighboring cell and the second neighboring cell.

18. The flash memory system of claim 17, wherein:
the cell flash memory includes rows and columns of the plurality of cells, and
each of the first neighboring cell and the second neighboring cell is positioned at the same column as a column of the first cell and at a row adjacent to a row of the first cell.

19. The flash memory system of claim 18, wherein the circuit is further configured to estimate interference states for decoding results of read operations on the plurality of cells by reading the rows of the plurality of cells sequentially and only once.

20. The flash memory system of claim 17, wherein in estimating the interference state, the circuit is further configured to:
calculate a probability density of a sum of two uniform random variables indicating programmed levels of the first neighboring cell and the second neighboring cell, respectively.

* * * * *